United States Patent
Li

(10) Patent No.: US 10,133,007 B2
(45) Date of Patent: Nov. 20, 2018

(54) ALL FIBER LASER INTERFERENCE LITHOGRAPHY SETUP AND METHODS

(71) Applicant: Wendi Li, Hongkong (HK)

(72) Inventor: Wendi Li, Hongkong (HK)

( * ) Notice: Subject to any disclaimer, the term of this patent is extended or adjusted under 35 U.S.C. 154(b) by 0 days.

(21) Appl. No.: 14/719,353

(22) Filed: May 22, 2015

(65) Prior Publication Data

US 2017/0160645 A1    Jun. 8, 2017

(30) Foreign Application Priority Data

May 26, 2014    (CN) .......................... 2014 1 0224663

(51) Int. Cl.
G03B 27/54    (2006.01)
G02B 6/36    (2006.01)
G02B 6/28    (2006.01)
G03F 7/20    (2006.01)

(52) U.S. Cl.
CPC .......... *G02B 6/3616* (2013.01); *G02B 6/2856* (2013.01); *G03F 7/70408* (2013.01)

(58) Field of Classification Search
CPC .. G02B 6/2856; G02B 6/3616; G03F 7/70408
USPC ........................................................ 355/67
See application file for complete search history.

(56) References Cited

U.S. PATENT DOCUMENTS

| 5,016,951 A * | 5/1991 | Deason ............... G02B 5/1857 359/10 |
| 6,522,433 B2 | 2/2003 | Kelsey |
| 8,582,079 B2 | 11/2013 | Liu |
| 2007/0023692 A1* | 2/2007 | Stenger ............... G03F 7/70408 250/492.2 |
| 2014/0118715 A1 | 5/2014 | Fu et al. |

FOREIGN PATENT DOCUMENTS

| CN | 101916042 | 12/2010 |
| CN | 202494863 | 10/2012 |
| CN | 103092002 | 5/2013 |

\* cited by examiner

*Primary Examiner* — Peter B Kim
(74) *Attorney, Agent, or Firm* — Treasure IP Group, LLC

(57) ABSTRACT

A laser interference lithography device using all-fiber-optic components is disclosed. In the said all-fiber laser interference lithography device, an input coupling fiber receives the coherent laser beam from a laser source and sends it to an optical fiber splitter. The optical fiber splitter splits the input laser beam into at least two sub-beams and outputs the multiple sub-beams through multiple output optical fiber. Adjustable fiber holders, each carrying one output fiber, tune the position and angle of output optical fibers to achieve desired interference patterns on a substrate.

20 Claims, 7 Drawing Sheets

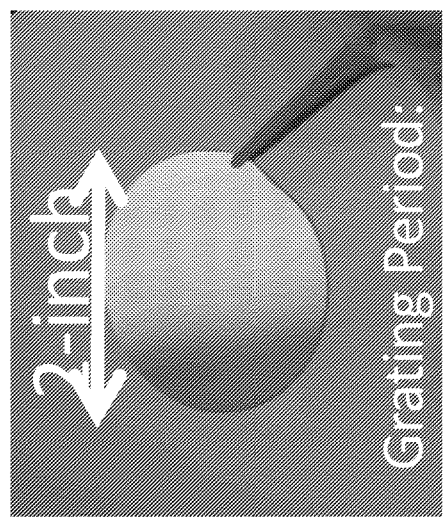
Figure 6
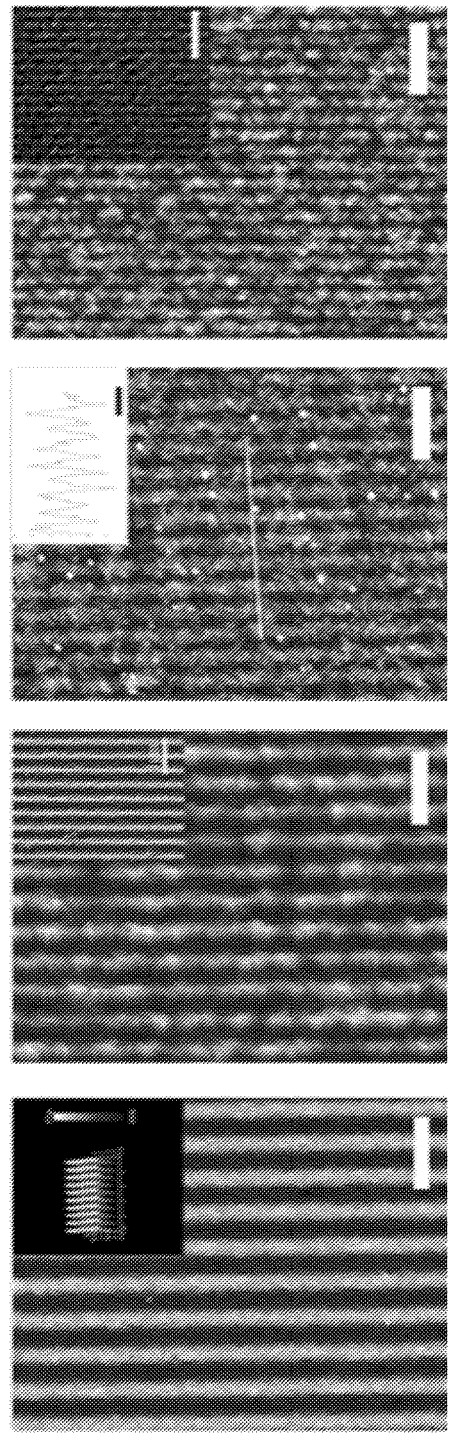
Figure 10
Figure 9
Figure 8
Figure 7

ALL FIBER LASER INTERFERENCE LITHOGRAPHY SETUP AND METHODS

CROSS REFERENCE TO RELATED APPLICATION

This application claims priority to Chinese Application No. CN 201410224663.1, filed on May 26, 2014. The Chinese Application is incorporated herein by reference in its entirety.

TECHNICAL AREA

This invention relates to the field of lithography. Specifically, it involves the setup and methodology for an all-fiber laser interference lithography system, using an optical fiber beam-splitter.

TECHNICAL BACKGROUND

Existing laser interference lithography systems use glass beam-splitters to split the original laser beam in free space. Normally, the original and subsequently split laser beams all propagate in free space. This setup requires extensive time for proper and accurate alignment. Changing interference patterns, especially altering their periods, requires realignment of the entire optical setup. Further, laser propagation in free space is deleteriously affected by environmental disturbances such as airflow or vibration.

Interference lithography is a method of fabricating submicron structures or arrays over a large scale (i.e. inches). Several types of regular and periodic patterns, including gratings, holes, pillars, cones and grids, can be produced after recording the interference of two or more coherent beams on photoresist. When a coherent laser beam is split into two or more beams that overlap within a certain area, there will be gratings or grids of regular light intensity patterns formed. These interference patterns, created by the split beam or beams, expose the photoresist, which subsequently "records" the interference patterns following development.

Unlike traditional optical techniques, laser interference lithography permits maskless configurations and rapid exposure on large-area substrates. Interference lithography can produce periodic nanostructures over a large area with high throughput and low cost, thus playing a key role in the emerging fields of energy production/efficiency, sensing, lighting, etc. The applications of periodic patterns include distributed feedback (DFB) lasers, field emission displays (FED), liquid crystal displays (LCD), advanced data storage applications, optical gratings, mythology standards and Moth-Eye subwavelength structures (SWS).

Interference lithography is the most common method to fabricate large-area, low-cost periodic structures. It is a well-known phenomenon that two coherent light waves can interfere, which can produce periodic patterns through two different schemes, i.e. the Lloyd mirror configuration and two-beam holography. While periods can be altered by changing the incident beam angle using a rotatable substrate holder, the Lloyd mirror configuration is restricted to mid-level pattern quality and a small exposure area, due to un-equal light paths and an imperfect reflective mirror. The two-beam holography setup has demonstrated higher pattern quality over a larger exposure area. However, altering the period in this configuration requires extensive realignment of optical components along each of the two split beams, which is very time-consuming and challenging, especially for periods less than 300 nm. Another challenge is that the two split beams can experience different environmental disturbances and air vibrations along their individual light paths, which induces phase noise that may blur interference patterns on the substrate.

CN103092002A describes a laser interference lithography system. However, CN103092002A uses discrete optical components to split and deliver the laser beams.

U.S. Pat. No. 6,522,433B2 describes an interference lithography technique utilizing holey fibers. The patent uses fibers with axially-formed holes to deliver laser beams for interference lithography. However, U.S. Pat. No. 6,522,433B2 still splits light beams in free space, and the aforementioned fiber is used in U.S. Pat. No. 6,522,433B2, increasing the cost. (In contrast, the potential patent uses fiber splitters for beam-splitting, and common polarization maintains single-mode fibers to deliver light).

U.S. Pat. No. 8,582,079B2 describes another interference lithography system. Nevertheless, in their technical scheme, light also propagates in free space, and discrete optical components are utilized to deliver and split light.

Sun, Y. L. et. al, 'Lloyd's mirror interferometer using a single-mode fiber spatial filter', Journal of Vacuum Science & Technology B, 2013. 31(2) reports an interference lithography system on the base of a Lloyd's mirror. However, their setup is manly used in low or medium-quality and small-area grating configurations, and cannot be used for large-area, high-quality lithography of periodic patterns.

Two-beam interference lithography in free space is used in large-area, high-quality and periodic pattern fabrication, but due to the inherent difficulty of assembly and frequent realignment of light beams, these systems are only utilized by major research institutes. These two-beam systems are not yet commercially viable for photolithography. Assembly, alignment and maintenance require professional, specialized skillsets, restricting commercial applications in the emerging areas of large-area, periodic nanostructure configurations.

SUMMARY OF THE INVENTION

This patent aims to address the aforementioned problems of system-wide realignment during pattern changes (most notably altering the period), and laser propagation in free space. Both issues make the interference system susceptible to environmental disturbances such as air flow or vibrations, which hamper the quality of interference lithography patterns.

The patent solves the above problems through using fiber-based components for laser beam splitting and coherent light delivery. Emitted light from the laser source is immediately coupled to a fiber that can provide insulation between light and environmental disturbances; flexible realignment of the system setup is achieved by using optical fibers and optical fiber beam-splitters to deliver and split light; flexible pattern period alteration is achieved by simply moving and relocating the fiber ends to change the angles of the two overlapped laser beams. The invention also employs a phase compensation mechanism based on phase detection results.

According to one aspect of the invention, an all fiber laser interference lithography setup is proposed, which includes:

An input coupling fiber, for coupling coherent laser beam from laser source to a fiber beam splitter;

Fiber beam splitters, for splitting laser beam from the input coupling fiber to at least two sub-beams, which are output by two or more output coupling fibers;

Adjustment units, for mounting the depicted output coupling fibers, and adjusting the position and emergence angles of the fiber ends to change the sub-beams illuminating on the substrate;

A phase detector, located behind the substrate and on a translation stage, for real-time detection of sub-beam phase changes;

A substrate stage for holding substrates, which controls the adjustment units in a closed loop based on detected phase changes, in order to compensate for measured phase disturbances.

According to another aspect of the invention, an all fiber interference lithography system is presented, which includes:

An input coupling fiber produces a coherent light beam from a laser source, coupled to an optical fiber beam splitter;

Through an optical fiber beam splitter, the coherent light beam from the laser source is split to at least two laser sub-beams, and through two or more output coupling fibers, the depicted laser sub-beams are output;

Through adjustment units, the depicted output coupling fibers are mounted, and the position and angles of depicted coupling fibers are manipulated, to adjust the laser sub-beams illuminating on the substrate.

Through a phase detector located behind the substrate and on the translation stage, the phase changes of the laser sub-beams are detected in real time;

Through the substrate stage that supports the substrate, the adjustment unit is controlled, based on the feedback of detected phase changes, to compensate for phase disturbances.

Through coupling the UV/near UV single frequency laser to the polarization-maintaining fiber, and then through the polarization-maintaining optical fiber beam splitter, the original laser beam is split into two beams. These two beams will expand in free space to form interference gratings, to expose photoresist, which can make large-area nanostructures. To date, this method has not been reported through research, nor is there similar products in the commercial market. Through using the all-fiber configuration, the previous problems in free space such as beam-splitting, alignment and angle alteration (i.e. changing the period) are solved.

DESCRIPTION OF THE DRAWINGS

According to the following descriptions and accompanying figures, it is easy to understand the advantages of this model:

FIGS. 6-10 show SEM and AFM measurement results of the substrate fabricated by the all-fiber laser interference lithography setup and accompanying methods of this invention;

DETAIL DESCRIPTION

For reference, the embodiment is illustrated in the accompanying figures; numbers correspond to components in each figure.

Figure 1:
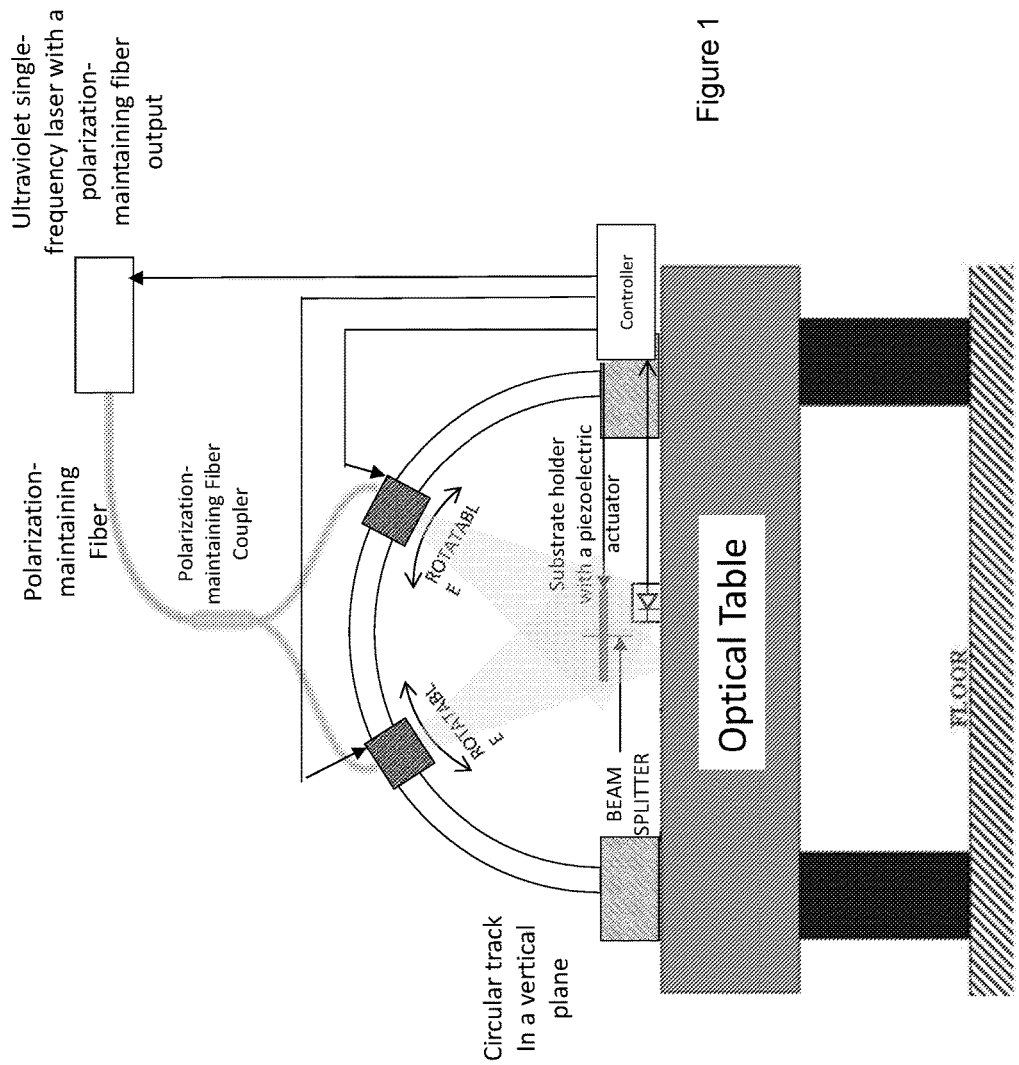
FIG. 1 demonstrates the scheme of the all-fiber laser interference lithography of the invention.

FIG. 1 explains the schematic diagram of the all-fiber laser interference lithography system proposed by the invention. The laser beam emitting from the 405 nm single frequency UV laser is coupled to a single-mode polarization maintaining fiber (PMF). The PMF and the 1×2 fiber beam splitter are connected, to acquire two laser beams of similar intensities. The two facets of the output fibers connected with the fiber beam splitter are steered to the substrate coated with photoresist. Because fibers having small-diameter cores behave as space fibers, circular Gaussian beams can optionally be acquired when the laser beams are emitted from the fiber facets. By adjusting the position and direction of the fibers, the two laser beams can be easily overlapped on the substrate. At the same time, the output fibers can be rotated to vertically-align the polarization of the two laser beams, producing ideal interference patterns.

Figure 2:
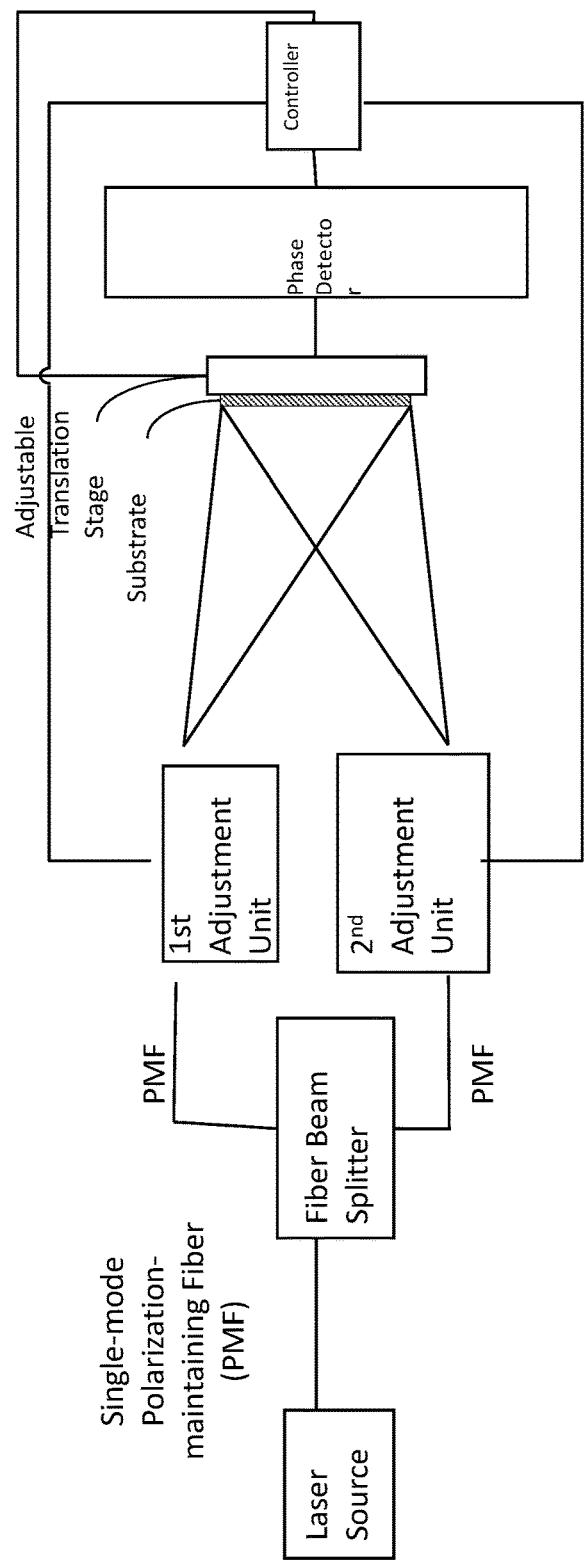
FIG. 2 shows the schematic diagram of the all-fiber laser interference lithography setup employed by this invention.
Figure 3:
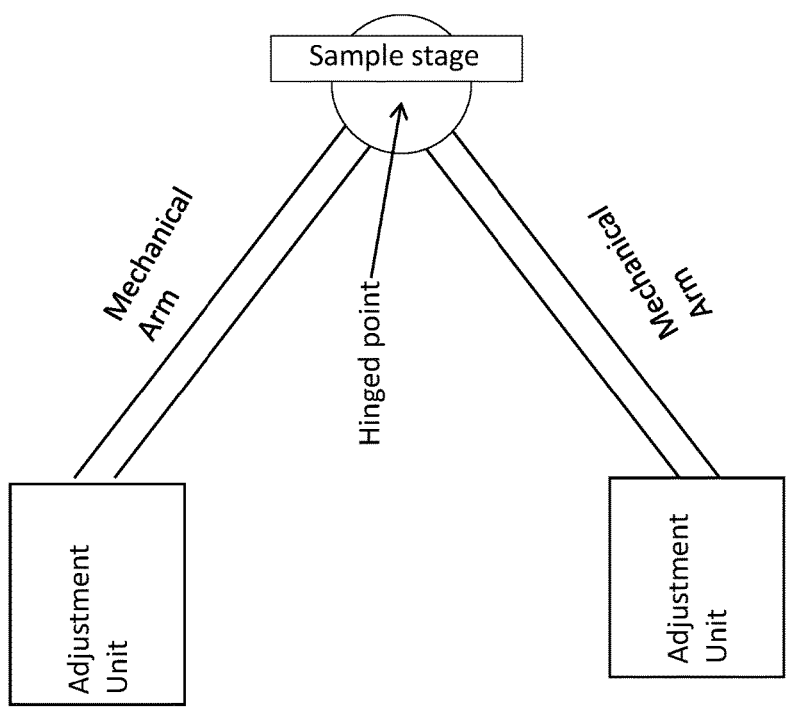
FIG. 3 shows the schematic diagram of the structure of the mechanical arm adjustment unit.

FIG. 2 shows the schematic diagram of the all-fiber laser interference lithography setup implemented based on the invention. As shown, the depicted all-fiber laser interference lithography system includes: a laser source; a input coupling fiber, for coupling the coherent laser beam from the laser source to an optical fiber beam splitter; an optical fiber beam splitter, for splitting the coherent laser beam from the input coupling fiber to at least two laser sub-beams, and through two or more output coupling fibers, the depicted laser sub-beams are emitted, and the laser sub-beams illuminating on the substrate are adjusted; adjustment units (first adjustment unit and second adjustment unit), for mounting the depicted output coupling fibers, and adjusting the positions and directions of the depicted output coupling fibers; a phase detector, located behind the substrate and on the translation stage, for real-time detection of the phase changes of the laser sub-beams; and a substrate stage for supporting the substrate, for closed-loop control of adjustment units based on detected phase changes, and for compensation of phase disturbances.

Optionally, the depicted laser source can be a UV/Near UV single frequency laser. The depicted laser source can be separated from the depicted setup or be integrated into the depicted setup.

Specifically, the depicted input coupling fibers and output coupling fibers can all be single mode polarization-maintaining fibers.

Optionally, the depicted all-fiber laser interference lithography setup also includes a control unit, for controlling substrate stage movement based on signals from the phase detector.

The depicted adjustment units are located on separate ends of the equal-length mechanical arms. The substrate, coated with photoresist, is located on the depicted intersection end of the rotating mechanical arms. The depicted intersection point of the mechanical arms determines the position of the substrate to be exposed. Based on the mechanism, the emergence angles of the emitted laser sub-beams are adjusted easily, to alter the periods of the gratings. Because flexible optical fibers are adopted to deliver coherent light, rotating the mechanical arms when altering the periods of the interference gratings will not change the transmitted power, modes or polarizations of the laser beams. On the contrary, in free-space interference lithography systems using optical components, changing the emergence angles of the laser sub-beams to alter the periods of the interference patterns requires realignment of all the space components. This is extremely time-consuming and technically demanding work.

Figure 4:
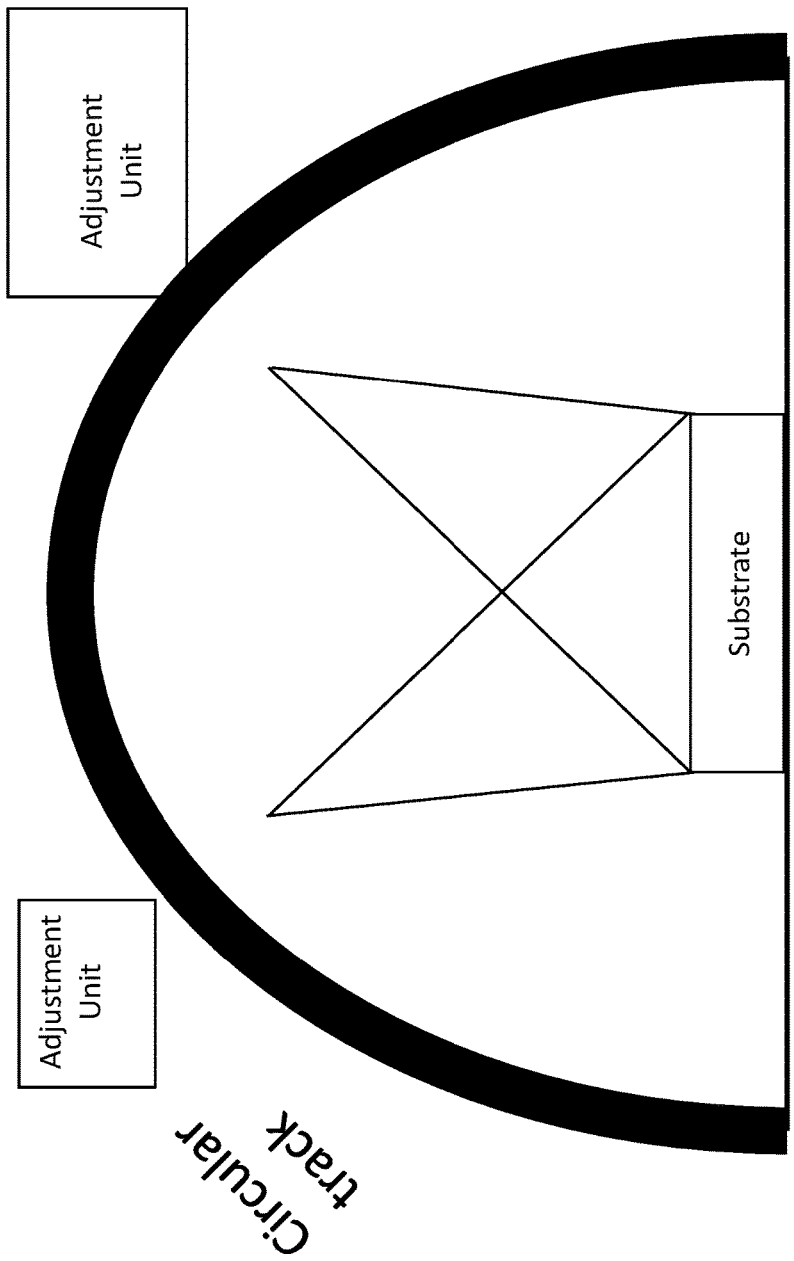
FIG. 4 shows the schematic diagram of the structure of the circular track adjustment unit.

The depicted setup in the invention can also adopt a circular track to substitute for intersecting mechanical arms. Specifically, the depicted units can all be located on the circular track. The substrate coated with photoresist lies in the same plane with the depicted circular track, and is located on the inner side of the circular track. FIG. 4 shows the schematic diagram of the adjustment unit of the circular track. Output coupling fibers mounted on the fixed circular track are actuated by a stepping motor to the position that has the included angle of the laser sub-beams meeting the requirement of the set period of interference patterns. Shown as FIG. 4, the output light unit mounted on the adjustment unit moves with the movement of the adjustment unit on the circular track, while maintains the transmitted power, mode or polarization of the laser beams.

The above depicted setup can also be arranged in a vertical configuration. The mechanical arms or the circular track are arranged perpendicular to the horizontal plane.

Optionally, the all-fiber laser interference lithography setup also includes a stepping motor, for changing the angles of the rotating mechanical arms to alter the periods of exposing, or through a piezoelectric motor to adjust the depicted substrate stage.

Optionally, the depicted substrate stage can be piezoelectrically actuated.

Optionally, the all-fiber laser interference lithography setup also includes a light spot-shaping unit. For example, square pinholes can be set on the light paths of the expanding laser sub-beams, to shape the exposed area on the substrate to be a square, and afford uniform exposure over a large area by stepping movements of the substrate stage.

Optionally, the depicted substrate stage can be rotatable to expose two-dimensional grid patterns.

In the setup of the invention, a 405 nm single frequency and single mode laser emits a coherent laser beam, and through a series of collimating optical components, the laser beam is coupled to a single-mode polarization-maintaining optical fiber. The single-mode polarization-maintaining optical fiber is connected to one or multiple polarization-maintaining fiber beam-splitters, to split the laser beam to several laser beams with similar intensities. On another side of the fiber beam-splitter, coherent laser beams emit from the fiber facets and expand in free space as a Gaussian distributed profile, and overlap on the photoresist-coated substrate. The overlapped laser beams from several fiber facets produce interference patterns; depending on the number and states of the overlapped laser beams, the produced interference patterns can be gratings or grids.

Figure 5:
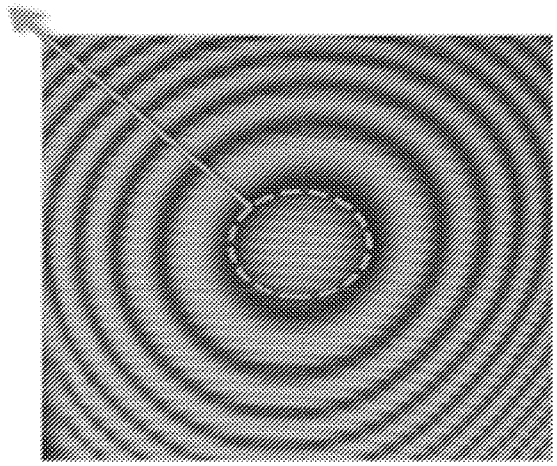
FIG. 5 shows the schematic diagram of the light-spot detector pattern in the receiving area of the optical fiber collimator.

Temperature fluctuations will perturb the fiber refractive index to a greater extent than that of free space. In order to acquire a stable interference exposure of long duration, passive or positive phase stabilization measures must then be employed in the system. Thus, the invention also includes a phase stabilization mechanism for the interference lithography patterns, which includes a phase detector on the translation stage, PID (proportion-integration-differentiation) control circuits or control programs, and a driver for the piezoelectrically-actuated substrate stage. The phase detector consists of a two beam interference generator, a fiber collimator and an optoelectronic detector. The two beam interference generator can be a beam splitter mounted on a translation stage, maintaining rigid stability with the substrate to be exposed. The transmitted light of one beam interferes with the reflected light of the other beam and generates circular interference fringes. The central light spot of the circular interference fringes (see FIG. 5) is received by a fiber collimator and coupled to a single mode or multi-mode fiber, then transmitted to an optoelectronic detector to be transformed to electronic signals. The phase difference between the two interference beams can cause 'swallow and spit' drifts of the circular interference fringes, which in turn change the power of the central light spot that the fiber collimator receives, and will further change the intensity of the electronic signals the optoelectronic detector outputs. PID control circuits or control programs compare the received signals from the optoelectronic detector with a certain set signal value, and do a PID algorithm on the errors to compute and send control signals to the piezoelectric stage. The control signals will be amplified by the driver of the piezoelectric stage to the voltage range required for driving the piezoelectric stage, then sent to the piezoelectric stage for actuation. The stage is actuated by piezoelectric ceramics, whereby the elongation of the piezoelectric ceramics is proportional to the control voltage (generated by the piezoelectric stage driver) sent to the stage. The aforementioned phase changes of the two coherent beams are compensated by the movement of the piezoelectric stage, which will maintain the output signal of the optoelectronic detector at the set value. Thus, the error signals calculated by the PID control circuits will approach zero, indicating that there are stable interference fringes on the substrate, held by the positioning stage.

The major source of phase disturbance for the two or more coherent beams is the environmental temperature fluctuations around the individual fibers. The phase changes caused by temperature disturbances will create drifts of the interference fringes on the substrate. By adjusting substrate stage positioning, the aforementioned positive phase compensation system tracks the interference fringe drift, keeping the relative position between the substrate and the interference fringes unchanged.

The system can also adopt passive phase stabilization measures, such as constant-temperature metal protective jackets protecting individual fiber links after beam split to suppress temperature fluctuations; and a substrate stage lock to keep the relative position between fiber output facets and the substrate moderately stable.

FIGS. 6-10 show images of the substrate fabricated by the invented all-fiber laser interference lithography setup and methods. In FIGS. 6-10, from left to right, the grating periods are 510 nm, 420 nm, 330 nm and 240 nm, separately. The images are acquired through exposing photoresist with the invented all-fiber laser interference lithography setup, followed by development and AFM & SEM profile characterization. Because the invention can easily adjust the light path to alter the periods of the exposed structures, the diverse periods of grating structures can be continuously exposed and acquired in a short time. FIGS. 6-10 also shows the ability of the invention to uniformly expose a large area (2-inch) substrate. In practical applications, the exposed area can be expanded to 4-inch or larger size substrates.

Figure 11:
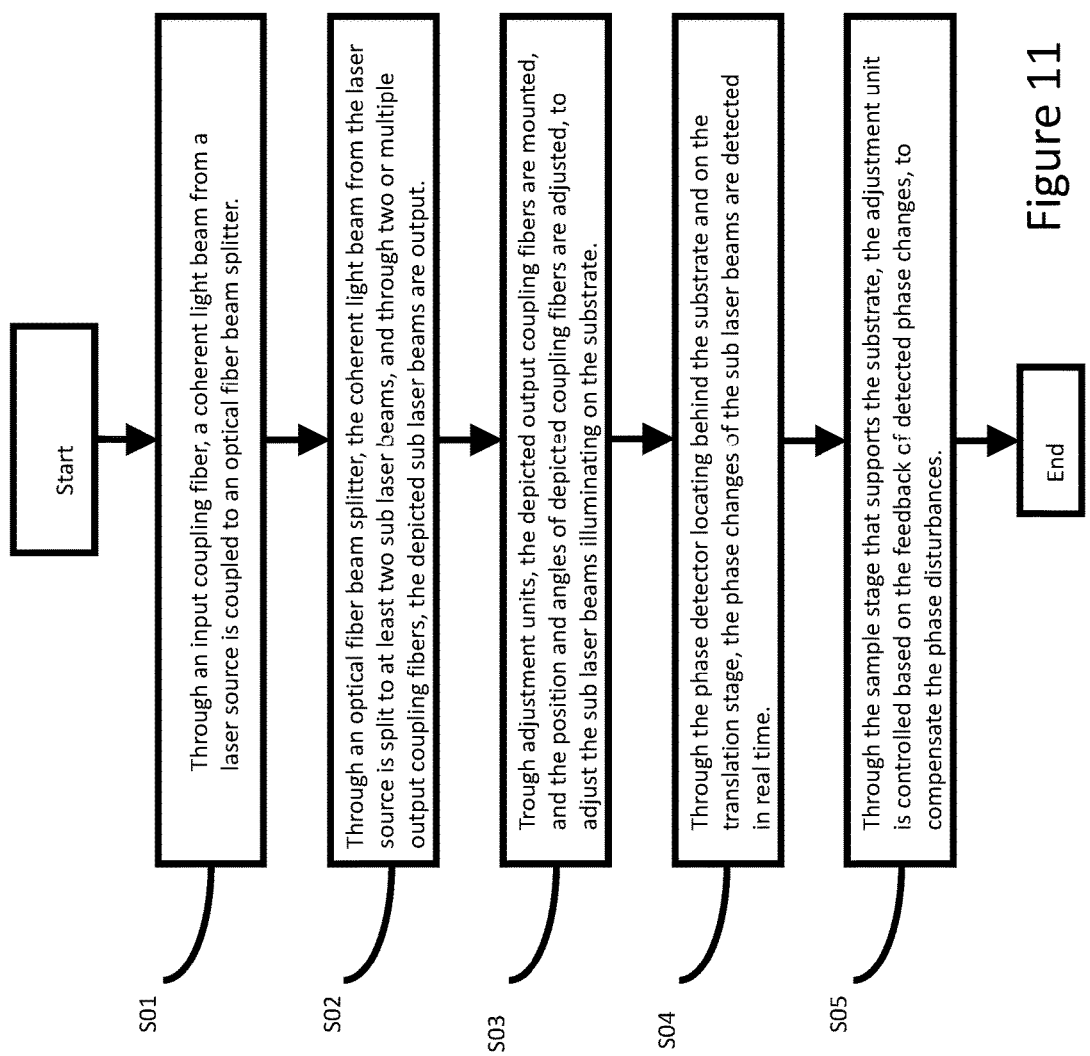
FIG. 11 shows the flow chart of the interference lithography methods according to this invention.

FIG. 11 shows a flow chart based on the invented all-fiber laser interference lithography methods. Specifically, the depicted methods include: through an input-coupling optical fiber, the coherent laser beam from laser source is coupled to a fiber beam splitter (S01); through the fiber beam splitter, the coherent laser beam from the input coupling optical fiber is split into at least two laser sub-beams, and through two or more output coupling fibers, the depicted laser sub-beams are output (S02); through adjustment units controlling the depicted output coupling fibers, the positions and angles of the depicted output coupling fibers can be changed to adjust the laser sub-beams illuminating the substrate (S03); through the real-time phase detector located behind the substrate and on the translation stage, the phase changes of the laser sub-beams are detected (S04); and through the positioning substrate stage that supports the substrate, the adjustment unit is controlled in a closed loop based on the detected phase changes, to compensate for phase disturbances (S05).

The setup and methods of the invention can also adopt laser sources, fibers, and fiber beam splitters aimed at short wavelengths (such as 355 nm, 351 nm and 266 nm) to configure periodic structures that have short periods.

When single-mode polarization-maintaining fibers are used to direct and deliver laser beams, the system is not sensitive to environmental noises and air disturbances, and is easily reconfigured. Compared with beam splitters in free space, the optical fiber beam splitter used for splitting coherent laser beams makes the system more compact and cost-effective. Through a simple cascade of optical fiber beam splitters, two or more laser beams can be emitted from fiber facets and overlapped to form a variety of complex interference shapes. Thus, the existing interference lithography system can be improved to realize the commercialization of a compact, low-cost and high-performance interference lithography setup used to fabricate periodic nanostructures over a relatively large area. Emerging energy (photovoltaic devices), sensing (plasmonic nanostructure sensors, biomedical sensors), and light emitting (nanostructures for LED light-trapping) applications will all benefit from the invention. Potential users of the interference lithography setup are research institutes, university laboratories and startup companies.

Common technicians in this area should understand, within the spirit and range of the accompanying claims, that the invention affords several formal and detailed improvements upon the typical interference lithography setup.

I claim:

1. A two-beam laser interference pattern generation device for creating periodic nanostructures, comprising:
    an ultraviolet laser source with a single-mode polarization-maintaining output fiber;
    a 1×2 polarization maintaining fiber splitter, which has one input fiber port connected to the output fiber of the laser source, and two polarization-maintaining output fibers, emitting approximately equal-intensity laser beams into free space towards a substrate stage;
    the substrate stage, which carries a substrate coated with a layer of photosensitive material to record an interference pattern from two interfering beams, and is driven by a closed-loop feedback stabilization mechanism, configured to track the interference patterns and eliminate drifting in interference patterns on the substrate by moving the substrate stage;
    a phase detector, located behind the substrate and on a translation stage, for real-time detection of phase changes of the laser sub-beams, wherein the phase detector includes a two-beam interference generator, which can be a beam splitter mounted on the translation stage, maintaining rigid stability with the substrate to be exposed, and the transmitted light of one beam interferes with the reflected light of the other beam and generates circular interference fringes;
    motorized output fiber holders, each carrying one output fiber port of the polarization maintaining fiber splitter; and
    a control mechanism, comprising a processing hardware unit and a control program, to operate the device.

2. The device according to claim 1, wherein the polarization maintaining fiber splitter is a fiber beam splitter.

3. The device according to claim 1, wherein the substrate stage comprises a piezoelectric actuator as an actuating element of the closed-loop feedback stabilization mechanism.

4. The device according to claim 1, wherein the closed-loop feedback stabilization mechanism on the substrate stage comprises
    a plate beam splitter, converting a phase difference between two beams into a light intensity pattern;
    a multi-mode optical fiber, collecting a light intensity at a fixed position;
    an optical sensor, converting the collected light intensity into an electrical signal; and
    a processing unit, to use this electrical signal to control the actuating element on the substrate stage for interference pattern tracking.

5. The device according to claim 1, wherein each motorized output fiber holder comprises a stepper motor, controlled by another processing unit, to change an angle between the two laser beams from the two output fibers of the fiber splitter.

6. The device according to claim 5, further comprising a circular track, on which the motorized output fiber holders can move, with the substrate stage placed at a center of the circular track.

7. The device according to claim 5, wherein each motorized output fiber holder further comprises two intersecting arms, which have one end joined together and carry the two output fiber holders on the other ends respectively.

8. The device according to claim 7, wherein the substrate stage is placed at on top of a intersecting point of the two arms.

9. The device according to claim 5, wherein the motorized output fiber holders move on a vertical plane while the circular track is arranged perpendicular to the horizontal plane.

10. The device according to claim 1, wherein the substrate stage has a rotatory stage to rotate the sample.

11. The device according to claim 1, wherein the substrate stage has a one-axis or two-axis linear stage which can perform step-and-repeat exposure to expose a large substrate by stitching multiple smaller exposure fields.

12. A multi-beam laser interference pattern generation device for creating periodic nanostructures, comprising:
    an ultraviolet laser source with a single-mode polarization maintaining fiber output;
    a polarization maintaining fiber splitting unit, which has one input fiber port connected to the output fiber of the laser source, and two or more polarization-maintaining output fibers, emitting approximately equal-intensity laser beams into free space towards a substrate stage;
    a substrate stage, which carries a substrate coated with a layer of photosensitive material to record an interference pattern from two interfering beams;
    motorized output fiber holders, each carrying one of the output fiber ports of the polarization maintaining fiber splitter;
    piezoelectric actuators on output fiber holders, each moving corresponding output fiber port according to a corresponding phase detector on the substrate stage, configured to maintain a constant phase difference between the corresponding laser beam and a reference laser beam and keep the interference pattern stable on the sample; and a control mechanism, comprising a processing hardware unit and a software program to operate the device.

13. The device according to claim 12, wherein the polarization maintaining fiber splitting unit is a 1×2 polarization maintaining fiber splitter or a cascade of multiple 1×2 polarization maintaining fiber splitters.

14. The device according to claim 12, wherein each of the piezoelectric actuators on output fiber holders are controlled by a closed-loop feedback stabilization mechanism, and each mechanism comprises a plate beam splitter to convert the phase difference between the laser beam from one output fiber and a reference bam into a light intensity pattern;

a multi-mode optical fiber to collect the light intensity at a fixed position;

an optical sensor to convert the collected light intensity into an electrical signal; and a processing unit to use this electrical signal to generate a control signal to the corresponding piezoelectric actuator for interference pattern stabilization.

15. The device according to claim 12, wherein each motorized output fiber holders comprises a stepper motor, controlled by a processing unit, to change the relative spatial arrangement of the multiple output laser beams.

16. The device according to claim 15, further comprising one or a plurality of circular tracks, on which the motorized output fiber holders moves with the substrate stage placed at the center of the circular tracks.

17. The device according to claim 15, further comprising a plurality of arms which have one end together and carry the multiple output fiber holders respectively.

18. The device according to claim 17, wherein the substrate stage is placed at the intersecting point of the multiple arms.

19. The device according to claim 12, wherein the substrate stage has a rotatory stage to rotate the sample.

20. The device according to claim 12, wherein the substrate stage has a one-axis or two-axis linear stage which can perform step-and-repeat exposure to expose a large substrate by stitching multiple smaller exposure fields.

* * * * *